United States Patent
Chang et al.

(10) Patent No.: US 11,061,581 B2
(45) Date of Patent: Jul. 13, 2021

(54) DATA STREAM ASSEMBLY CONTROL

(71) Applicant: ARM IP LIMITED, Cambridge (GB)

(72) Inventors: Marcus Chang, Cambridge (GB); Hugo John Martin Vincent, Cambridge (GB); Milosch Meriac, Cambridge (GB)

(73) Assignee: ARM IP Limited, Cambridge (GB)

( * ) Notice: Subject to any disclaimer, the term of this patent is extended or adjusted under 35 U.S.C. 154(b) by 320 days.

(21) Appl. No.: 15/771,250

(22) PCT Filed: Dec. 23, 2015

(86) PCT No.: PCT/GB2015/054141
§ 371 (c)(1),
(2) Date: Apr. 26, 2018

(87) PCT Pub. No.: WO2017/077262
PCT Pub. Date: May 11, 2017

(65) Prior Publication Data
US 2018/0314438 A1 Nov. 1, 2018

(30) Foreign Application Priority Data
Nov. 5, 2015 (GB) .................................... 1519577

(51) Int. Cl.
*G06F 3/06* (2006.01)
*H03M 7/30* (2006.01)
*G06F 12/1081* (2016.01)

(52) U.S. Cl.
CPC .......... *G06F 3/0614* (2013.01); *G06F 3/0655* (2013.01); *G06F 3/0673* (2013.01);
(Continued)

(58) Field of Classification Search
CPC ..................................................... G06F 3/0614
(Continued)

(56) References Cited

U.S. PATENT DOCUMENTS

| | | | | |
|---|---|---|---|---|
| 5,818,536 A | * | 10/1998 | Morris | H04N 19/105 375/240.15 |
| 6,031,798 A | * | 2/2000 | James | G06F 3/0605 369/30.28 |

(Continued)

OTHER PUBLICATIONS

Wikipedia, "Lossless compression", 2020 (Year: 2020).*
(Continued)

*Primary Examiner* — Ondrej C Vostal
(74) *Attorney, Agent, or Firm* — Patterson Thuuente Pedersen, P.A.

(57) ABSTRACT

Technology for operating a data-source device for assembling a data stream compliant with a data stream constraint. The technology comprises acquiring a plurality of data items by accessing data in a memory and/or transforming data. Prior to completion of the accessing data in a memory, an accessor is selected based on an estimate of access constraint. Prior to completion of the transforming data, a transformer is selected based on an estimate of transformation constraint, wherein the transportation constraint comprises any data acquisition constraint. The access and transformation constraints are dependent upon system state it the data-source system. The data items are positioned in the data stream, and, responsive to achieving compliance with the data stream constraint, the data strewn is communicated.

10 Claims, 3 Drawing Sheets

(52) U.S. Cl.
CPC ......... *G06F 12/1081* (2013.01); *H03M 7/30* (2013.01); *G06F 2212/621* (2013.01)

(58) Field of Classification Search
USPC ........................................................ 709/231
See application file for complete search history.

(56) References Cited

U.S. PATENT DOCUMENTS

| | | | | |
|---|---|---|---|---|
| 7,318,116 | B2* | 1/2008 | Gallo | G06F 11/1443 709/219 |
| 7,536,389 | B1* | 5/2009 | Prabhakar | G06F 16/951 |
| 2002/0059644 | A1* | 5/2002 | Andrade | H04N 21/8586 725/136 |
| 2003/0014160 | A1* | 1/2003 | Nordquist | G05B 19/0428 700/275 |
| 2004/0049480 | A1* | 3/2004 | Burrill | G06F 16/40 |
| 2004/0187136 | A1* | 9/2004 | Bhogal | G06F 16/958 719/311 |
| 2005/0035886 | A1* | 2/2005 | Labelle | H04N 19/156 341/51 |
| 2005/0071591 | A1* | 3/2005 | Goodman | G06F 21/6227 711/163 |
| 2005/0261800 | A1* | 11/2005 | Goodman | G11B 17/228 700/214 |
| 2006/0005173 | A1* | 1/2006 | Eng | G06F 8/457 717/140 |
| 2006/0133475 | A1* | 6/2006 | Bruls | H04N 19/56 375/240.1 |
| 2006/0218199 | A1* | 9/2006 | Kishi | G06F 16/215 |
| 2008/0021993 | A1* | 1/2008 | Compton | H04L 41/0853 709/224 |
| 2008/0091709 | A1* | 4/2008 | Chang | G06Q 10/06 |
| 2008/0195746 | A1* | 8/2008 | Bowra | H04L 65/1026 709/231 |
| 2008/0304636 | A1* | 12/2008 | Souluer | H04M 7/1295 379/88.17 |
| 2009/0234500 | A1* | 9/2009 | Tanaka | G11B 17/225 700/250 |
| 2010/0046612 | A1* | 2/2010 | Sun | H04N 19/187 375/240.02 |
| 2010/0054279 | A1* | 3/2010 | Feldbauer | H04N 19/115 370/475 |
| 2010/0177885 | A1* | 7/2010 | Bates | G06Q 10/0637 380/28 |
| 2010/0299443 | A1* | 11/2010 | Hu | H04N 21/8455 709/231 |
| 2011/0178994 | A1* | 7/2011 | Fujihara | G06F 3/0604 707/690 |
| 2013/0051454 | A1* | 2/2013 | Sze | H04N 19/91 375/240.02 |
| 2013/0223542 | A1* | 8/2013 | Kim | H04N 19/91 375/240.29 |
| 2013/0332620 | A1* | 12/2013 | Gahm | H04N 21/6373 709/231 |
| 2014/0149596 | A1* | 5/2014 | Emerson, III | H04L 51/046 709/231 |
| 2015/0023404 | A1* | 1/2015 | Li | H04N 19/152 375/240.02 |
| 2015/0221314 | A1* | 8/2015 | Disch | G10L 19/025 704/500 |
| 2015/0230762 | A1* | 8/2015 | Alpert | A61B 5/4884 600/425 |
| 2015/0269039 | A1* | 9/2015 | Akirav | G06F 11/2092 714/4.11 |
| 2015/0331870 | A1* | 11/2015 | Bystrom | G06F 16/44 707/661 |
| 2015/0334413 | A1* | 11/2015 | Gorin | H04N 19/44 375/240.26 |
| 2016/0196072 | A1* | 7/2016 | Smith | G06F 3/0689 711/112 |

OTHER PUBLICATIONS

Latronico et al., "A Vision of Swarmlets", 2015 (Year: 2015).*
Merriam-Webster, "transform", 2021 (Year: 2021).*
Office Action dated Jul. 15, 2019 for GB Application No. GB1519577. 9, 4 pages.
Written Opinion dated May 8, 2018 for PCT Application No. PCT/GB2015/054141, 8 pages.
Examination Report for dated Jan. 30, 2020 for Application No. GB 1519577.9, 3 pages.
International Search Report & Written Opinion for PCT/GB2015/054141, dated Jun. 16, 2016, 11 pages.
Combined Search and Abbreviated Examination Report for GB 15 19577.9, dated Apr. 20, 2016, 5 pages.
Wikipedia: "Lossless compression", internet article, Nov. 3, 2015 (Nov. 3, 2015), XP002758844, Retrieved from the Internet: URL:https:// en.wikipedia.org/w/index.php?title=Lossless_compression&oldid= 688807398 [retrieved on Jun. 16, 2016].

* cited by examiner

DATA STREAM ASSEMBLY CONTROL

RELATED APPLICATIONS

The present application is a National Phase entry of PCT Application No. PCT/GB2015/054141, filed Dec. 23, 2015, which claims priority from GB Patent Application No. 15 19577.9, filed Nov. 9, 2015, said applications being hereby incorporated by reference herein in their entirety.

FIELD OF THE DISCLOSURE

The present disclosure relates to technology for controlling the assembly of data streams at a data-source device or component, more particularly to assembly of data streams for passing from the data-source device or component to another, and more especially to such assembly when the data to be assembled into the data stream may originate as data from a memory or as data resulting from a data creation or transformation function.

BACKGROUND

In assembling data streams from disparate data sources, it is well known to those of skill in the data processing art that constraints and costs apply to the various activities of data acquisition, creation and transformation. Such costs and constraints may apply to the assembling of the data stream as a whole—it may be, for example, that a data stream is required to be made available at a particular time, or within a processor cycle consumption constraint. Many other such constraints are known to those of skill in the art. Similarly, there are costs and constraints that apply to the sub-activities involved in the assembly of the data stream, such as, but not limited to, the time taken in seeking and transferring data from memory or other storage devices, the processor cycles consumed in performing a data transform, or the battery power consumed in preparing data for inclusion in the data stream.

Although the present technology is not limited to any particular class of device, it is known that in what is known as the Internet of Things (or IoT), many devices are, of necessity, subject to strict constraints on power consumption and provision of data processing and storage resources generally. This is as a result of the need, for example, to produce many IoT devices at low cost and with a view to keeping them within very tight power consumption budgets. It is clearly not desirable to have highly sophisticated, resource- and power-hungry devices embedded in everyday consumer and industrial goods, as that would disadvantageously increase the manufacturing costs to the producer and the purchase and ongoing use costs to the owners of such goods.

For example, a heating system in the home may gather information from various temperature sensors and control the activation of heaters based on the gathered information; a factory pollution monitoring sensor may gather information from various chemical sensors and arrange maintenance based on the gathered information; while a healthcare provider may use wireless sensors, such as heart rate monitors, to track the health of patients while they are at home. A domestic refrigerator may be provided with the capability to recognize encoded data associated with a perishable food item, store the data in device storage, and subsequently, on being triggered by a program that monitored the data, warn a user over a network to a smartphone of an impending "use by" date for the food item. In none of these is it desirable to incur any waste of resources, and thus any technology that can provide efficient functionality to mitigate costs and constraints is highly desirable.

In a first approach, the disclosed technology provides a machine-implemented method of operating a data-source device for assembling a data stream compliant with a data stream constraint, and comprising acquiring a plurality of data items by at least one of accessing data in a memory and transforming data; prior to completion of the accessing data in a memory, selecting an accessor based on an estimate of access constraint; prior to completion of the transforming data, selecting a transformer based on an estimate of transformation constraint, wherein the transformation constraint comprises any data acquisition constraint; wherein the access and transformation constraints are dependent upon system state at the data-source system; positioning the plurality of data items in the data stream; and responsive to achieving compliance with the data stream constraint, communicating the data stream.

DESCRIPTION OF THE DRAWINGS

Implementations of the disclosed technology will now be described, by way of example only, with reference to the accompanying drawings, in which.

DETAILED DESCRIPTION

Figure 1:
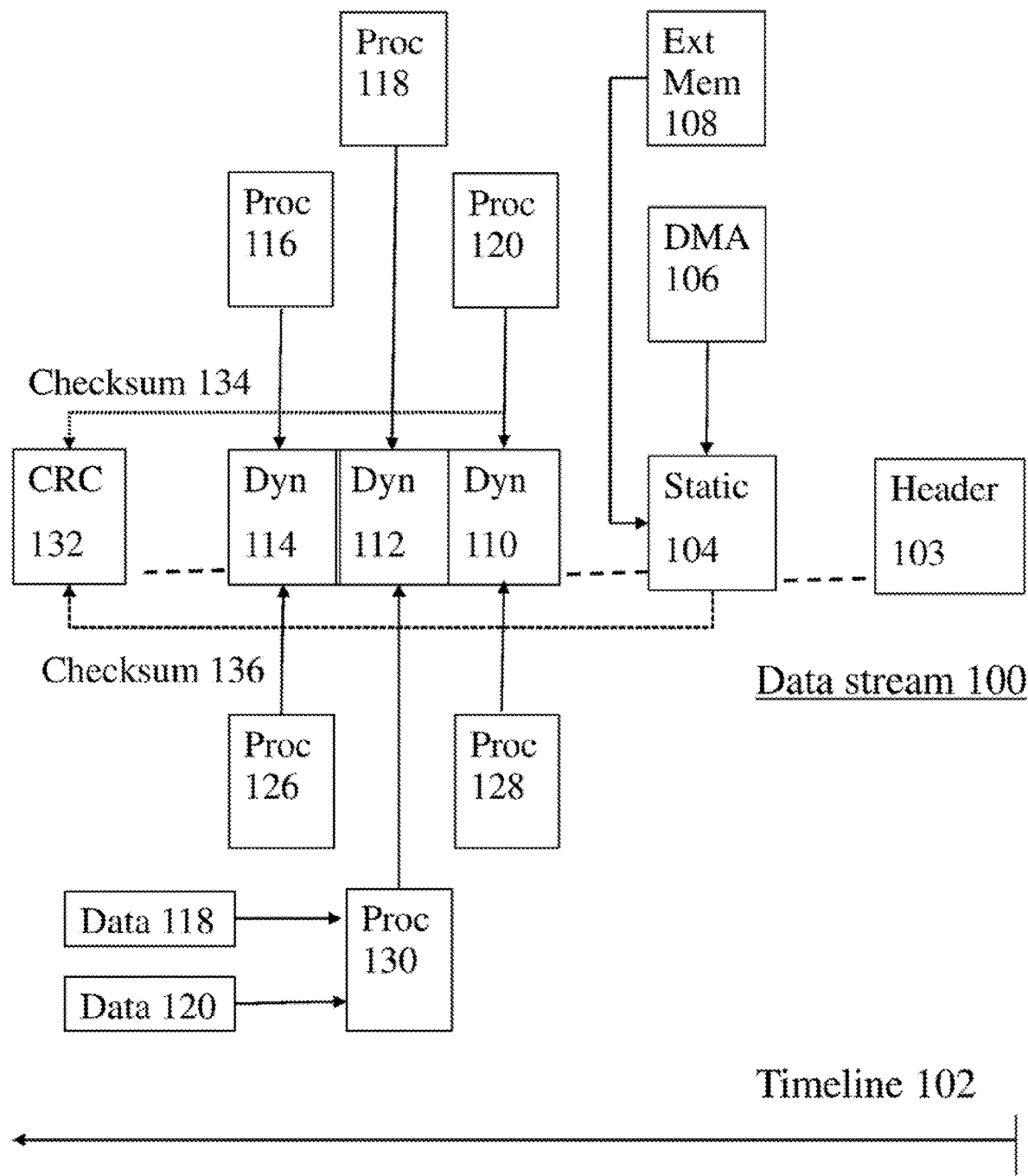
FIG. 1 depicts one simplified example of a data stream under construction, with its sources of data, plotted against a timeline.

Turning now to FIG. 1, there is shown an example of a data stream 100, where the data stream is under construction, plotted against timeline 102. The data stream is constructed starting with header 103, to which are added various payload data items, which may include static data 104, retrieved from storage for example by direct memory access (DMA) 106 from a processor memory or by other means from an external memory (Ext Mem) 108. The same item may be obtainable from more than one location, and each location may be subject to differing costs and other constraints. For simplicity, only one exemplary static data item is shown; however, it will be clear to one of skill in the art that most data streams will comprise more than a single such item. Static data 104 will normally have been stored in some storage location, and will simply be retrieved and positioned as-is in the data stream. By contrast, dynamic data 110, 112, 114 is transformed in some way to prepare it for inclusion in data stream 100. In the example, dynamic data items (Dyn) 110, 112, 114 respectively may be transformed by processes (Proc) 120, 128; 118, 130; and 116, 126. The same item, as shown in the figure, may be obtainable by more than one transformer process, and each transformer may be subject to differing costs and other constraints, including, as shown for Proc 130, the costs or constraints involved in obtaining input data (Data) 118, 120. Acquiring data, either static or dynamic, may be performed serially or by parallel processes, and, where parallel processes are used, a preferred process may be selected during processing time according to a variety of criteria, as will be described in more detail below. In the example shown in FIG. 1, the tail of the data stream comprises a cyclic redundancy check (CRC) trailer created from checksums, examples of which are 134, 132, of data items such as 103, 104, 110, 112, or 114 during the construction of the data stream.

Constraints may include, but are not limited to, time constraints such as the requirement to complete one or more actions by a predetermined time. Constraints may also represent resource costs, such as the cost in CPU cycles or storage access. An important constraint in the IoT field of art, for example, is the limitation of power available in certain devices that are battery-operated—for such devices, driving external storage devices or using communications means to access remote data consumes power in a way that may be constrained by battery life. Again, in the IoT field, certain devices may be constrained by the quantity of energy they can obtain from energy harvesting power sources. A further constraint to be considered when data is to be transformed before inclusion in the data stream is that of transactionality—certain operations must be performed atomically (that is, completed in all aspects, or rolled back to a previous state if they cannot be so completed). The additional resource requirements of certain transactional processing activities may thus also need to be taken into account.

Costs of access and processing may not always be precisely determinable in computing, but certain estimates may be made and used to select preferred means of acquiring data, whether static or dynamic, for insertion in the data stream. Decision engines are already known in some aspects of the computing art, and such a technology can be implemented in such a way as to operate on limited information and on the basis of statistical methods, rather than having a need for mechanistic determinism.

Further constraints may include security requirements—for example, it might be necessary to avoid passing any confidential data via any insecure intermediate storage, and this may impose an additional cost burden. Similarly, if any of the data is personally identifiable information and there are legal restrictions in a home jurisdiction, it may be necessary to avoid having such data stored or processed in a foreign jurisdiction having less stringent controls.

Figure 2:
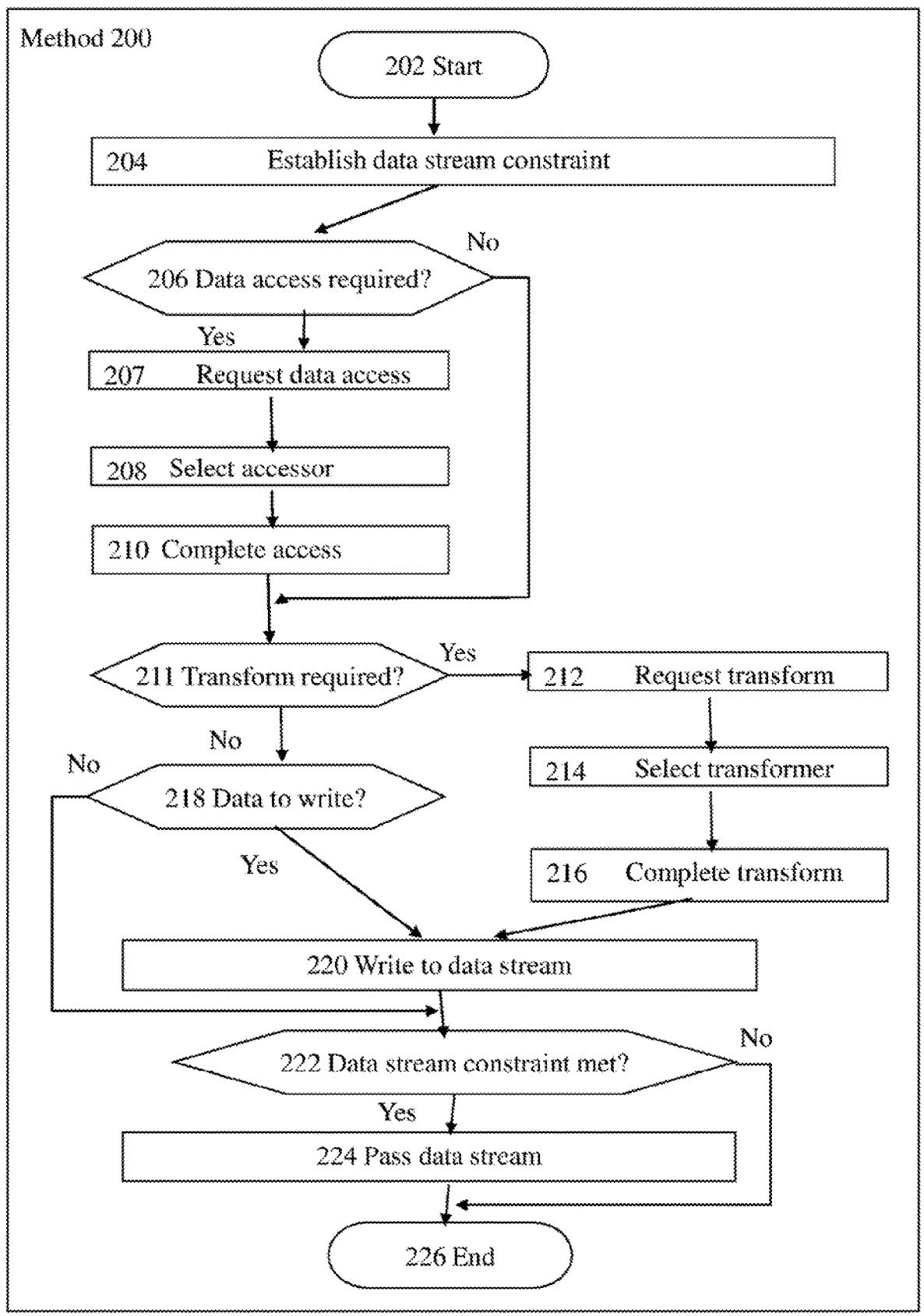
FIG. 2 depicts one method of operation of the disclosed technique.

Turning now to FIG. 2, there is shown one method of operation of the disclosed technique. Method 200 begins at Start step 202 and at step 204 an overall constraint for the data stream is established or determined. At test step 206, a test is made to determine whether data access is required. If the test outcome at test step 206 is negative, the process continues at test step 211. If the test outcome at test step 206 is positive, data access is requested at step 207. Either at the point of the request or later during data access processing, an accessor is selected at step 208, and the data access processing completes at step 210.

At test step 211, a test is performed to determine whether a transformation of data is required. If the outcome of test step 211 is negative, the process continues at test step 218. If the outcome of test step 211 is positive, a transformation is requested at step 212. Either at the point of the request or later during transformation processing, a transformer is selected at step 214, and the transformation processing completes at step 216. At test step 218, it is determined whether, there having been no requirement for a transform at test step 211, there is data to write. If the outcome of test step 218 is negative, the process continues at test step 222. If the outcome of test step 218 is positive, or if a transform was performed at steps 212 to 216, the static or dynamic data is written to the data stream at step 220.

The process continues to test step 222, where it is determined whether the overall data stream constraint has been met. If the outcome of test step 222 is negative, the process continues to End step 226. If the outcome of test step 222 is positive, the overall data stream constraint has been met—for example, a time-sensitive data stream has been completed on time—and the data stream is communicated at step 224 to a further device, system or system component—for example, to a co-processor within the local system or to a remote monitoring station. After the passing of the data stream at step 224, the process completes at End step 226.

Thus there is provided a method of operating a data-source system for assembling a data stream compliant with a data stream constraint and responsive to achieving compliance the data stream constraint, positioning data in the data stream and passing the data stream to a data-sink system. The method involves acquiring a plurality of data items by accessing data in a memory and/or transforming data. Based on constraint estimates for accessing or transforming the data, the method comprises selecting accessors and/or transformers.

System state may also be taken into account in establishing the constraint estimates, and may also be modified to change one or more constraint estimates, by, for example, altering a CPU clock speed, making an otherwise reserved portion of a CPU available, forcing out other data from a memory, changing a buffer availability, or forcing de-reservation of a previously reserved bandwidth. The resource cost of modifying the system state may also be taken into account in estimating the constraints, so that the system can elect to modify or not modify the system state based on the resource cost.

In one variant, selecting an accessor or a transformer may be based on an outcome of a parallel execution by a plurality of accessors or transformers. An additional function may also be provided to store indicia referring to a previous selection of an accessor or a transformer, where the indicia may be used to control a subsequent instance of data stream assembly. Thus, for example, if a DMA was selected in preference to a slower disk spin-up, seek and read, that selection for the particular action may be stored and reused when the same or a closely-related data stream is being assembled, thereby avoiding the need to repeat the cost/constraint estimation for the new instance. This variant may be further improved by "aging" the indicia, that is, by setting a counter to count the repeat instances and to discard the indicia after a predetermined number of instances.

In a further variant, the technique may operate by injecting instructions by a constraint compiler to control the steps of selecting an accessor or a transformer by evaluating at least one system constraint and temporarily modifying the system state. Such a constraint compiler may be used to compile system constraints into sets of conditional or fixed instructions to operate as a decision engine, reasoning about system-level constraints at run-time, and implementing temporary state changes (for example by invoking a processor clock multiplier) as necessary. The injected instructions may thus be invoked at decision points in the data stream assembly process to select appropriate tools to handle constraints as needed from time to time. Such a decision engine may operate on the basis of simple criteria, such as deadline times for completion of an action, or on more complex criteria, such as estimated battery charge remaining, maximum system power consumption or maximum running temperature of the system.

Figure 3:
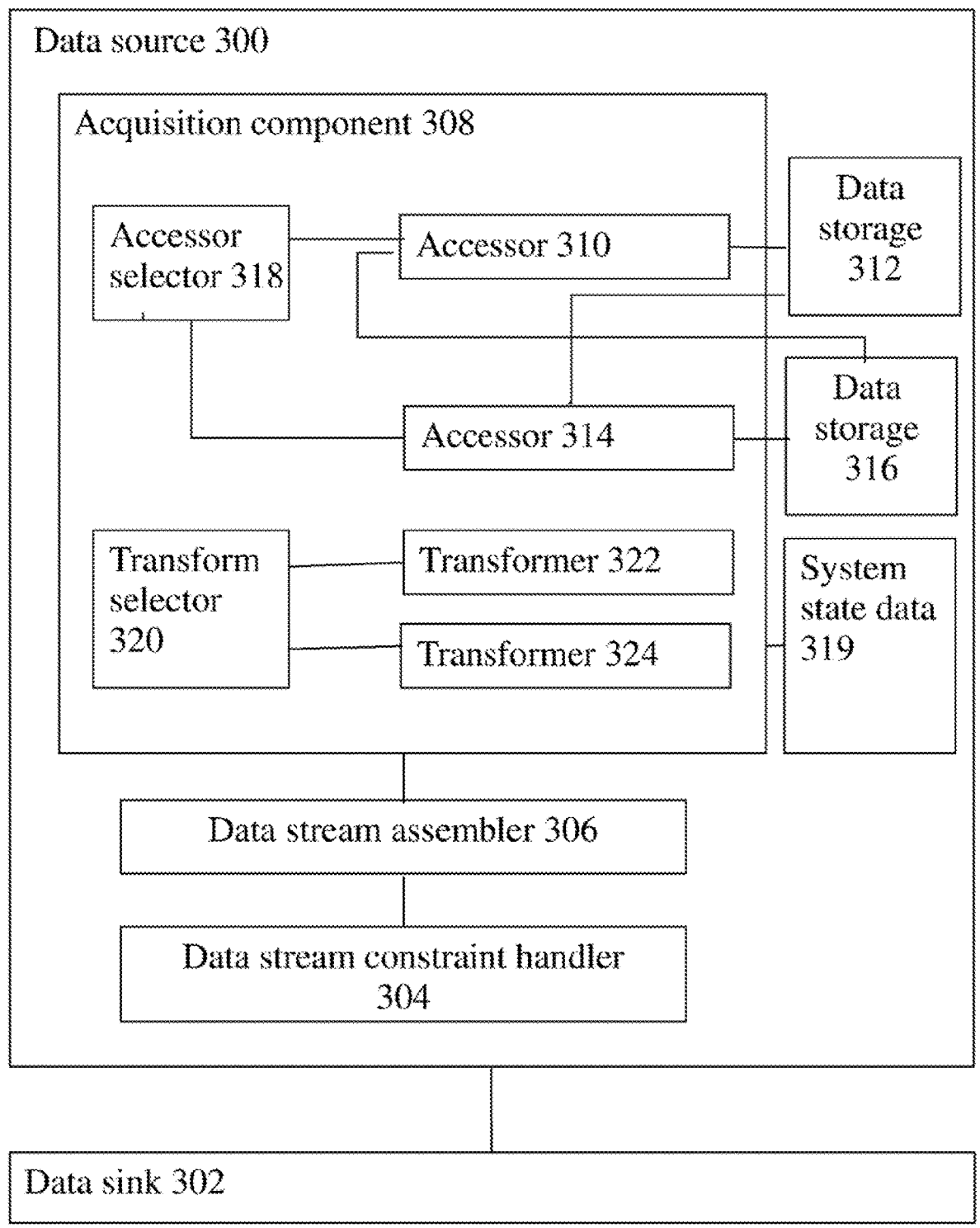
FIG. 3 depicts a device operable in accordance with the technique.

Turning to FIG. 3, there is shown a data source 300 device operable in accordance with the disclosed technique. Data source 300 comprises an acquisition component 308 operable to acquire data for incorporation into a data stream.

Acquisition component is in electronic communication with plural data storage components here represented as data storage 312 and data storage 316 to acquire static data by data access operations, which may, as described above, be subject to constraints and costs. Accordingly, acquisition component 308 comprises accessor selector 318, operable to select a preferred accessor from plural accessors represented here by accessor 310 and accessor 314.

Acquisition component 308 further comprises plural transformers operable to transform data, the plural transformers being represented here as transformer 322 and transformer 324. Transform selector 320 is operable to select a transformer for transforming data from the plurality of transformers.

Both accessor selector 318 and transform selector 320 are able to take account of system state, accessible to acquisition component 308 from system state data 319, when selecting from the respective pluralities of accessors and transformers.

Acquisition component 308 is operable to supply data (either static data accessed by one of accessors 310, 314, or dynamic data transformed by one of transformers 322, 324) to data stream assembler 306, which constructs the data stream within the constraints set by, and compliance with which is determined by, data stream constraint handler 304. Responsive to a positive outcome of at least one constraint compliance test conducted by data stream constraint handlers 304, data source 300 is operable to pass the data stream to data sink 302, which may, as described above, be a further device, a further system of devices, or another internal component of the same system as the data source 300.

In one variant, acquisition component may be operable to modify system state data 319, as previously described, to attain improved efficiency of assembly of the data stream.

As will be appreciated by one skilled in the art, the present techniques may be embodied as a system, method or computer program product. Accordingly, the present techniques may take the form of an entirely hardware embodiment, an entirely software embodiment, or an embodiment combining software and hardware.

Furthermore, the present techniques may take the form of a computer program product embodied in a computer readable medium having computer readable program code embodied thereon. The computer readable medium may be a computer readable signal medium or a computer readable storage medium. A computer readable medium may be, for example, but is not limited to, an electronic, magnetic, optical, electromagnetic, infrared, or semiconductor system, apparatus, or device, or any suitable combination of the foregoing.

Computer program code for carrying out operations of the present techniques may be written in any combination of one or more programming languages, including object oriented programming languages and conventional procedural programming languages.

For example, program code for carrying out operations of the present techniques may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog™ or VHDL (Very high speed integrated circuit Hardware Description Language).

The program code may execute entirely on the user's computer, partly on the user's computer and partly on a remote computer or entirely on the remote computer or server. In the latter scenario, the remote computer may be connected to the user's computer through any type of network. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

It will also be clear to one of skill in the art that all or part of a logical method according to embodiments of the present techniques may suitably be embodied in a logic apparatus comprising logic elements to perform the steps of the method, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In one alternative, an embodiment of the present techniques may be realized in the form of a computer implemented method of deploying a service comprising steps of deploying computer program code operable to, when deployed into a computer infrastructure or network and executed thereon, cause said computer system or network to perform all the steps of the method.

In a further alternative, an embodiment of the present technique may be realized in the form of a data carrier having functional data thereon, said functional data comprising functional computer data structures to, when loaded into a computer system or network and operated upon thereby, enable said computer system to perform all the steps of the method.

It will be clear to one skilled in the art that many improvements and modifications can be made to the foregoing exemplary embodiments without departing from the scope of the present technique.

The invention claimed is:

1. A machine-implemented method of operating a data-source device for assembling a data stream compliant with a data stream constraint by accessing data in memory, comprising:
   selecting an accessor based on an estimate of an access constraint wherein the accessor is to access static data in memory;
   wherein:
   said access constraint is dependent upon system state of said data-source device;
   acquiring a plurality of data items by accessing static data with the accessor;
   positioning said plurality of acquired data items in said data stream; and
   responsive to achieving compliance with said data stream constraint, communicating said data stream.

2. The method of claim 1, further comprising modifying said system state to meet at least one of said data stream constraint and said access constraint.

3. The method of claim 1, wherein said system state comprises at least one of a CPU clock speed, a CPU availability, a power availability, a harvested energy availability, an available memory size, a buffer availability and a reserved bandwidth.

4. The method of claim 2, further comprising estimating a resource cost of said modifying and electing to modify or not modify said system state based on said resource cost.

5. The method of claim 1, further comprising injecting instructions by a constraint compiler to control said steps of selecting an accessor by evaluating at least one system constraint and temporarily modifying said system state.

6. The method of claim 1, and further comprising selecting said accessor based on an outcome of a parallel execution by a plurality of accessors.

7. The method of claim 1, and further comprising storing indicia referring to a selection of an accessor, said indicia to control at least a subsequent data stream assembly instance.

8. The method of claim 7, further comprising setting a counter to count a plurality of said instances and to discard said indicia after a predetermined number of said instances.

9. An electronic device comprising embedded logic elements for performing a method of operating a data-source device for assembling a data stream compliant with a data stream constraint accessing data in memory, the method comprising:
   selecting an accessor based on an estimate of an access constraint wherein the accessor is to access static data in memory;
   wherein:
   said access constraint is dependent upon system state of said data-source device;
   acquiring a plurality of data items by accessing static data with the accessor;
   positioning said plurality of acquired data items in said data stream; and
   responsive to achieving compliance with said data stream constraint, communicating said data stream.

10. A non-transitory computer readable medium comprising computer-executable instructions that, when loaded into a computer system including at least one processor and executed on the at least one processor, cause said computer system to perform a method of operating a data-source device for assembling a data stream compliant with a data stream constraint by accessing data in memory, the method comprising:
   selecting an accessor based on an estimate of an access constraint wherein the accessor is to access static data in memory;
   wherein:
   said access constraint is dependent upon system state of said data-source device;
   acquiring a plurality of data items accessing static data with the accessor;
   positioning said plurality of acquired data items in said data stream; and
   responsive to achieving compliance with said data stream constraint, communicating said data stream.

* * * * *